United States Patent [19]
Brouillette et al.

[11] Patent Number: 5,334,046
[45] Date of Patent: Aug. 2, 1994

[54] CIRCUIT CARD INTERFACE SYSTEM

[75] Inventors: Peter Brouillette, Franklin; Charles S. Pickles, N. Attleboro, both of Mass.

[73] Assignee: Augat Inc., Mansfield, Mass.

[21] Appl. No.: 20,772

[22] Filed: Feb. 22, 1993

[51] Int. Cl.⁵ .............................. H01R 23/72
[52] U.S. Cl. ...................... 439/540; 361/790
[58] Field of Search ............ 439/64, 540, 377; 361/683, 790, 791

[56] References Cited

U.S. PATENT DOCUMENTS

| | | | |
|---|---|---|---|
| D. 320,003 | 9/1991 | Komatsu | D13/147 |
| D. 322,604 | 12/1991 | Komatsu | D14/114 |
| 4,818,239 | 4/1989 | Erk | 439/540 |
| 4,858,070 | 8/1989 | Buron et al. | 361/384 |
| 4,868,713 | 9/1989 | Banjo et al. | 361/392 |
| 4,887,188 | 12/1989 | Yoshida et al. | 361/413 |
| 4,914,552 | 4/1990 | Keemer | 361/415 |
| 4,996,631 | 2/1991 | Freehauf | 361/415 |
| 5,051,101 | 9/1991 | Komatsu | 439/159 |
| 5,080,609 | 1/1992 | Fabian et al. | 439/540 |
| 5,085,590 | 2/1992 | Galloway | 439/95 |
| 5,116,247 | 5/1992 | Enomoto et al. | 439/660 |
| 5,151,847 | 9/1982 | Rautenberg | 361/395 |
| 5,176,523 | 1/1993 | Lai | 439/64 |
| 5,225,968 | 7/1993 | Ma | 439/44 |

FOREIGN PATENT DOCUMENTS 2-207467  8/1990  Japan .................... 439/284

OTHER PUBLICATIONS

"PCMCIA" Personal Computer Memory Card International Association, PC Card Standard, Release 2.0 Booklet, Sep. 1991.

Primary Examiner—Neil Abrams
Attorney, Agent, or Firm—Weingarten, Schurgin, Gagnebin & Hayes

[57] ABSTRACT

A circuit card interface system of minimized vertical clearance, capable of interfacing one or more circuit cards to a relatively small space on a mother board. The interface system includes an interfacing connector assembly and at least one stacking connector assembly, each adapted to receive a circuit card. The conductors of the interfacing connector assembly are coupled to a substrate such as a mother board. The interfacing connector assembly can be used alone or with one or more electrically interconnected stacking connector assemblies. Rapid electrical attachment of each stacking connector assembly is accomplished by mating a cooperating portion of the stacking connector assembly with a portion of the underlying interfacing connector assembly.

9 Claims, 7 Drawing Sheets

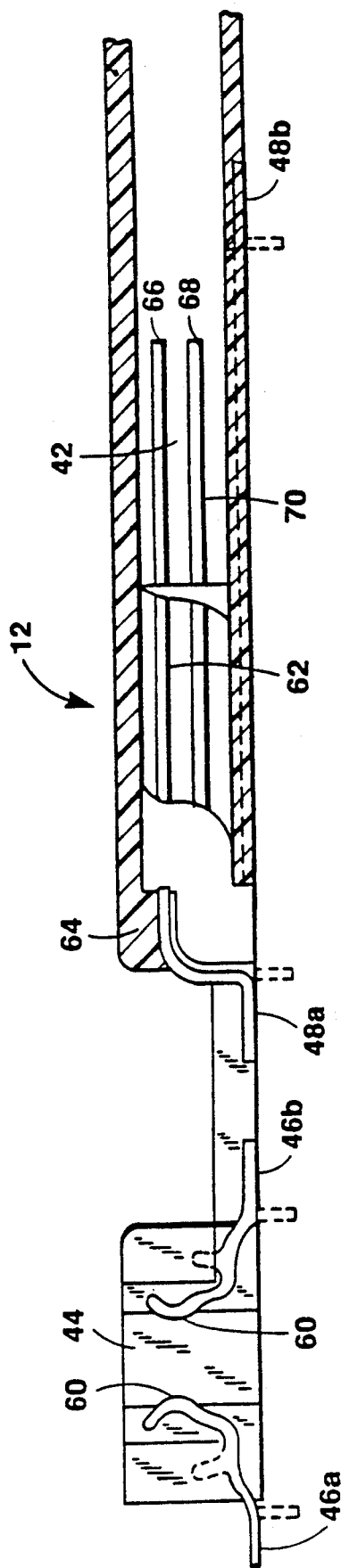
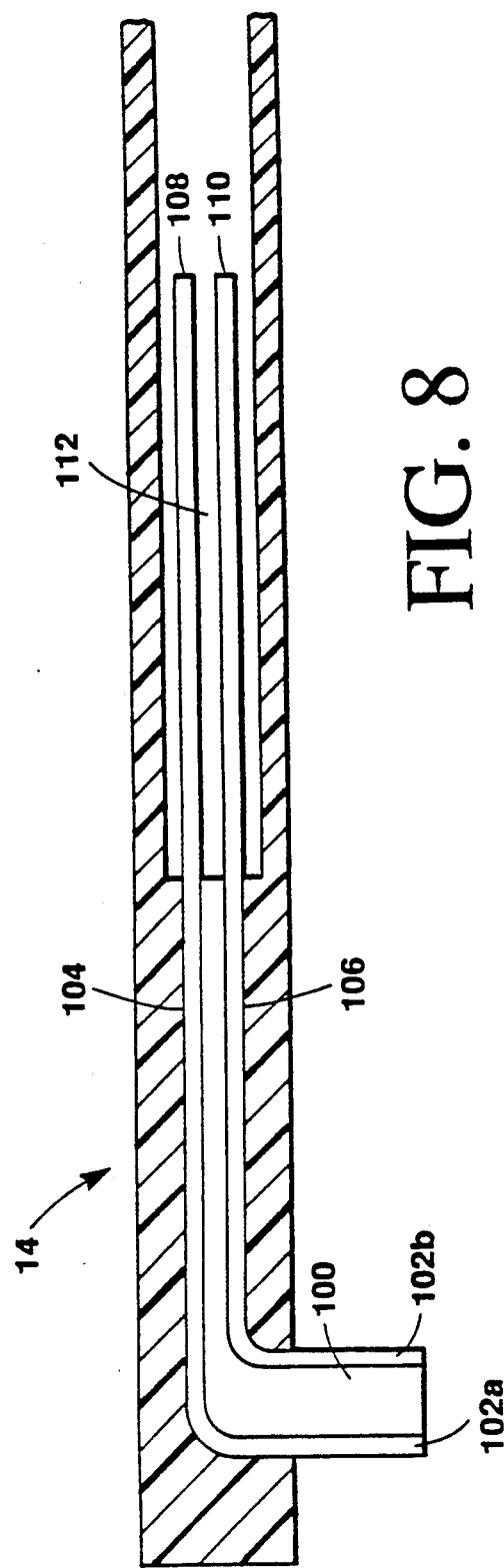
FIG. 6
FIG. 8

CIRCUIT CARD INTERFACE SYSTEM

FIELD OF THE INVENTION

This invention relates generally to circuit board interface connectors, and more specifically to stackable circuit board interface connector assemblies.

BACKGROUND OF THE INVENTION

It is often desirable to install two or more electronic circuit boards in close proximity to each other in a relatively small area. For example, it may be desirable to place a pair of memory boards in close proximity to each other in order to minimize space utilization, while still providing discrete electrical signal paths to each circuit board. So-called card cages have been used in the past to minimize inter-board spacing. This approach, however, typically requires a bulky frame.

Furthermore, to provide the discrete electrical signal paths between a mother board and an edge connector of a circuit board, complex individual wiring is required. Such wiring has been provided by wires bundled in cables, or by ribbon cables. Such wiring arrangements are commonly subject to induced capacitive interference and cross-talk, forcing the addition of expensive and undesirable shielding and pull-down or pull-up circuits to stabilize signals or power carried in those wires. A further problem with such wiring arrangements is that the length of the conductors linking the mother board to the card cage connectors results in time delays and signal degradation.

SUMMARY OF THE INVENTION

The present invention provides a circuit card interface system of minimized vertical clearance for mechanically and electrically connecting at least one circuit card to an associated substrate, such as a mother board.

According to one embodiment of the invention, the circuit card interface system includes an interfacing connector assembly and a stacking connector assembly, each adapted to receive a circuit card. Interfacing connector conductors are terminated in tails, surface mounted to a substrate, enabling higher conductor density. The interfacing connector assembly can be used alone or with one or more stacking connector assemblies. Rapid and simple electrical attachment of the interface and stacking connector assemblies is accomplished by mating cooperating interconnections.

The circuit cards to be connected can be PCMCIA (Personal Computer Memory Card International Association), standard PC memory cards, fax cards, I/O cards, floppy or optical disk drives mounted on circuit cards or the like. Signal paths for each circuit card are minimized in length and spaced apart by insulators, substantially reducing electrical interference and propagation delays.

Features of the invention include provision of a connector arrangement in which electrical and mechanical interference and propagation delay between the circuit cards is minimized. The connector arrangement facilitates a minimized connector footprint and reduced space consumption on a substrate or mother board. The connector arrangement also can include an open connector configuration for circuit card probing and ventilation.

DESCRIPTION OF THE DRAWINGS

These and other features and advantages of the present invention will be better understood by reading the following detailed description, taken together with the drawings wherein:

FIG. 6 is a side section view of the forward portion of the interfacing connector assembly of FIG. 5 taken along lines 6—6 of FIG. 5;

FIG. 8 is a side section view taken along lines 8—8 of FIG. 7;

DETAILED DESCRIPTION

Figure 1:
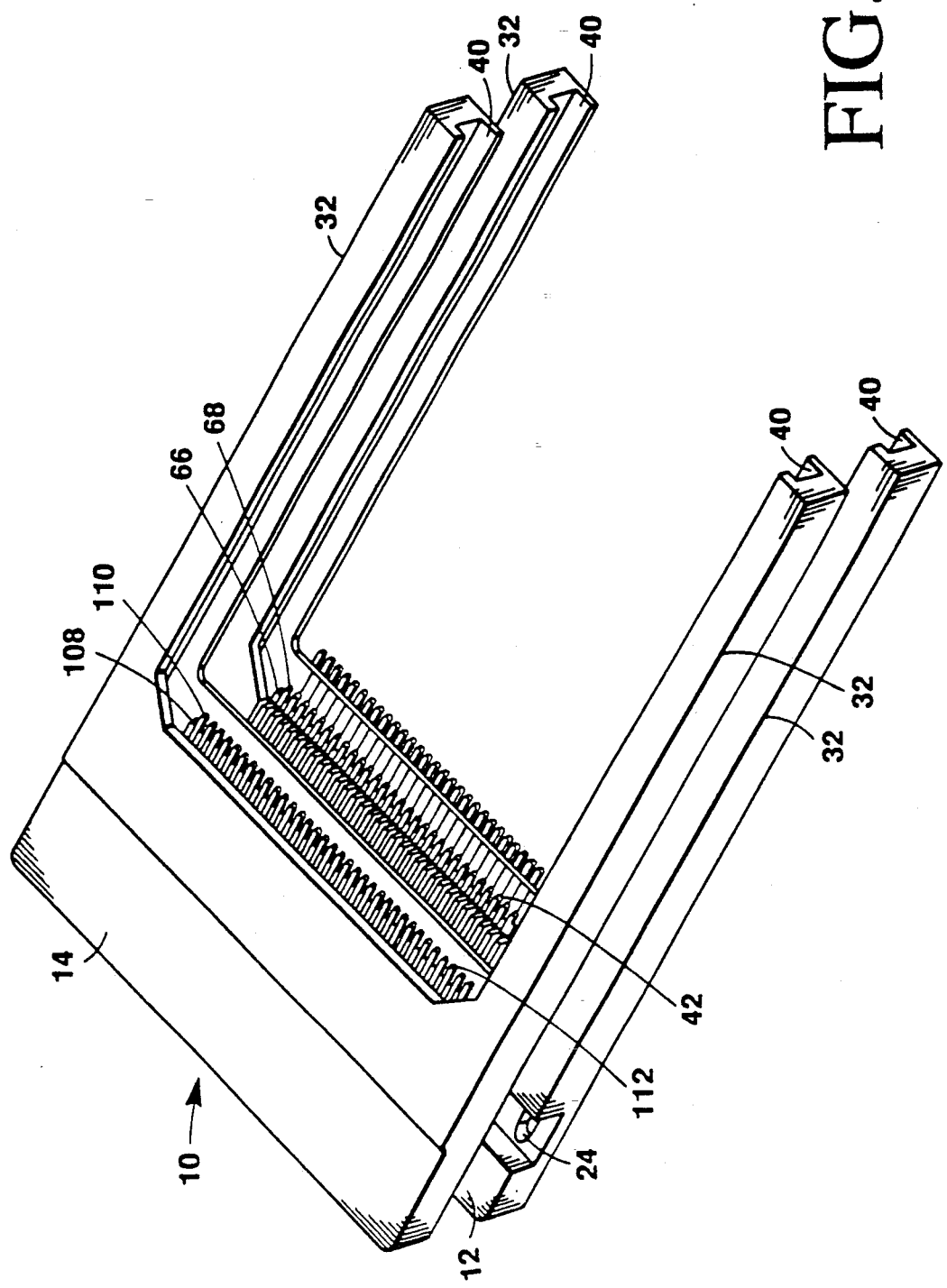
FIG. 1 is a top perspective view of a circuit card interface system according to the invention.

Referring now to FIG. 1, a circuit card interface system 10 includes an interfacing connector assembly 12 and a stacking connector assembly 14. In an exemplary embodiment, the circuit card interface system 10 is mechanically mounted on a mother board (not illustrated) by fasteners such as socket head screws (not illustrated) which pass through screw holes 24 into the mother board.

Figure 2:
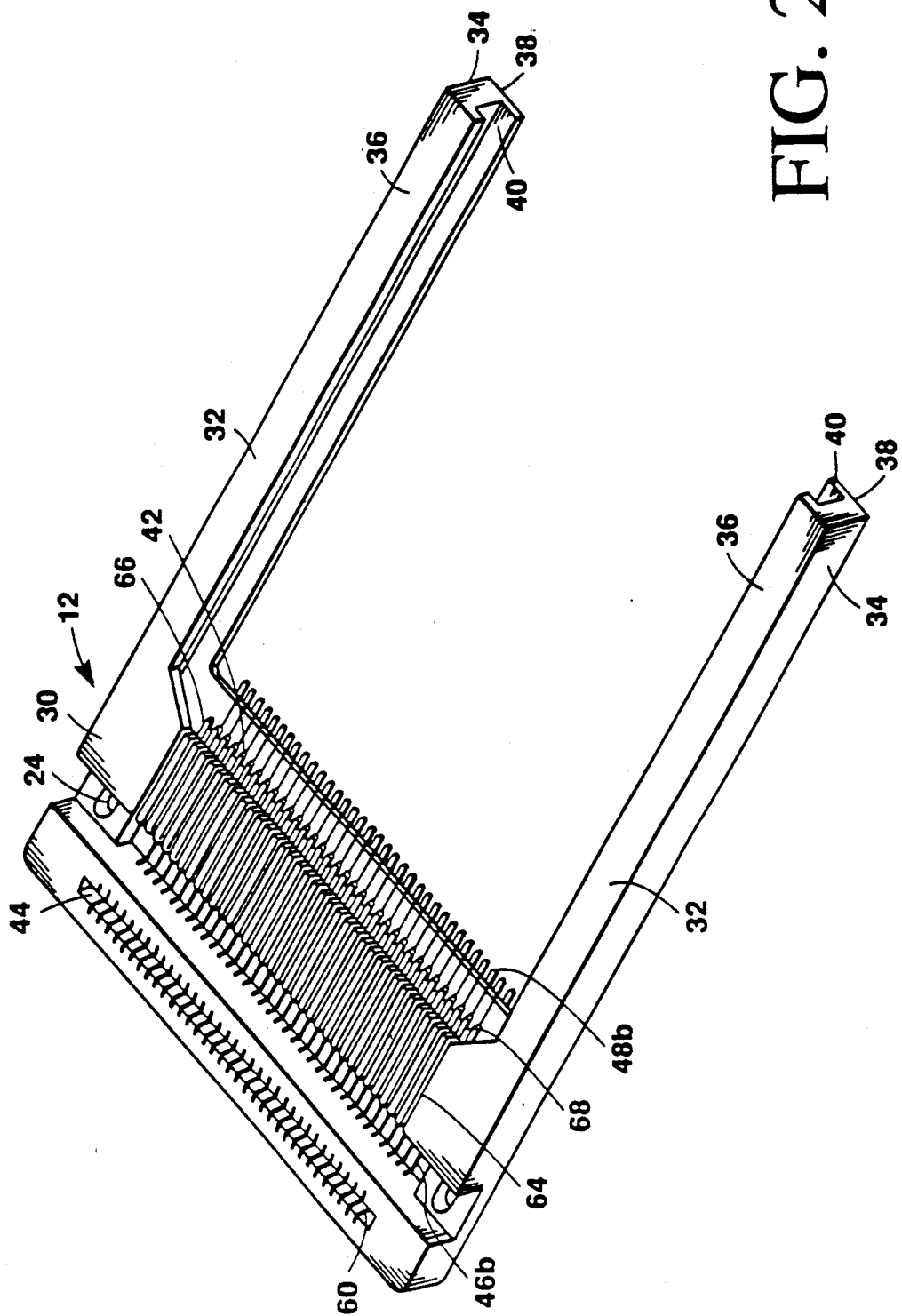
FIG. 2 is a top perspective view of an interfacing connector assembly according to the invention.

The interfacing connector assembly 12, as illustrated in FIG. 2, has a substantially U-shaped frame 30. The frame is fabricated, for example, from any of various light weight, resilient, and insulative materials such as plastic. The frame 30 includes two card guide members 32. Each of the card guide members 32 has a side wall 34, an upper surface 36 and a lower surface 38. In the illustrative embodiment, a card guide channel 40 is formed between the upper and lower surfaces 36, 38 and into an interior surface of the respective side walls 34. The card guide channel 40 is dimensioned to receive removable circuit cards such as PCMCIA cards Type I (90a) and Type II (90b), illustrated in FIGS. 3a, and 3b, respectively, and described in PCMCIA PC Card Standard Release 2.0, or Type III cards described in subsequent releases of the PCMCIA Card Standard, which are incorporated herein by reference. The card guide channel 40 is configured to allow circuit cards to slide freely therein and to maintain alignment of the circuit card with contacts of the interfacing connector assembly, as the card is being inserted in the interfacing connector assembly 12.

Figure 4:
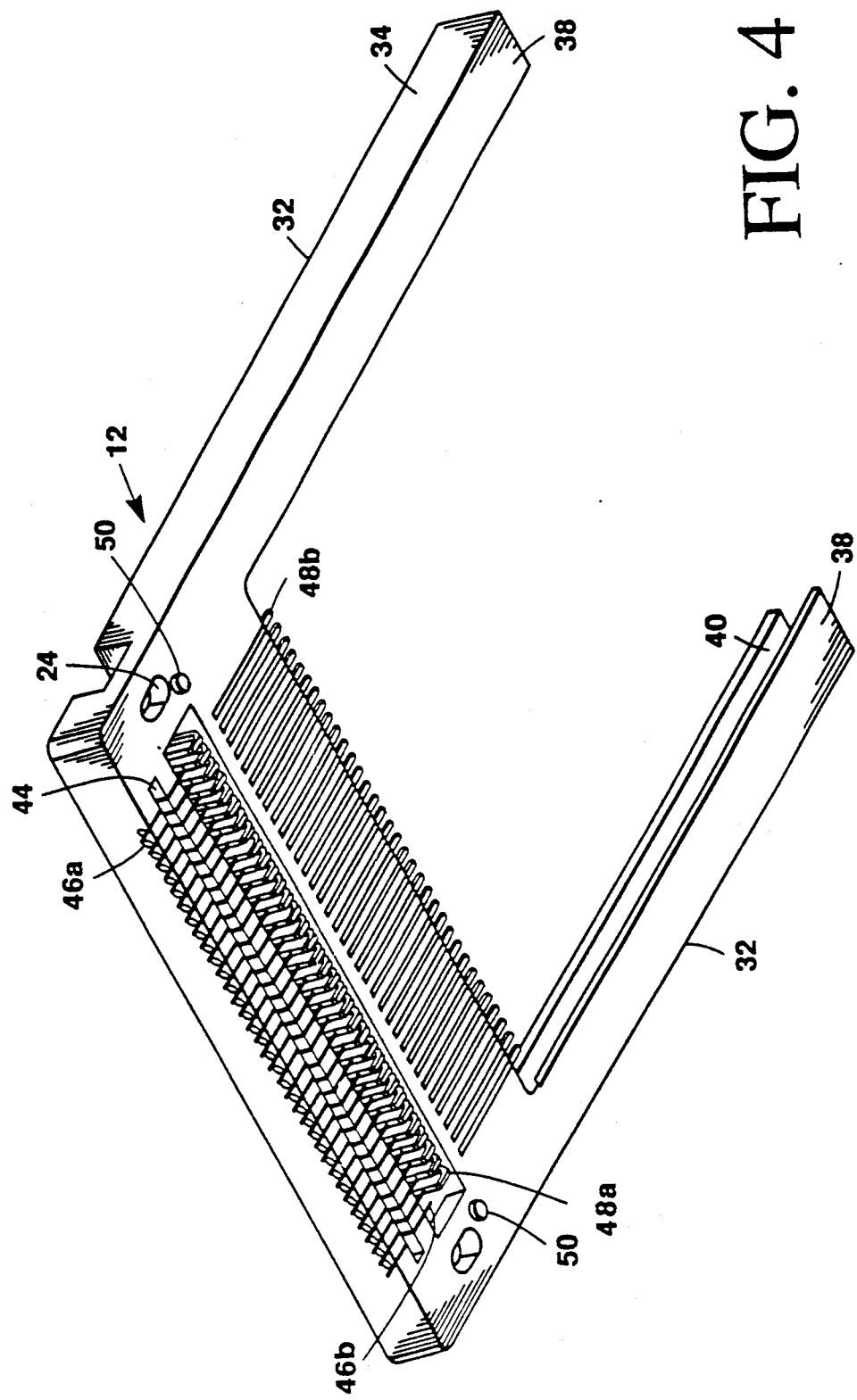
FIG. 4 is a bottom perspective view of the interfacing connector assembly of FIG. 2.

In the illustrative embodiment of FIGS. 1 and 2, electrical connection between the interfacing connector assembly 12 and the stacking connector assembly 14 is facilitated by a card edge style connector receptacle or interface channel 44, as shown clearly in FIG. 2, located in a forward end of the interfacing connector assembly 12. As illustrated in FIG. 4, which depicts an underside or board mounting side of the interfacing connector assembly 12, the card edge receptacle 44 includes a plurality of forward surface mount leads 46a, 46b. The forward surface mount leads 46a, 46b provide electrical signal paths between conductors on a stacking connector assembly 14 electrically interconnected with the interfacing connector assembly 12, as discussed hereinafter, and electrical interconnections on a substrate or mother board (not illustrated).

A plurality of rearward surface mount leads 48a, 48b provide electrical signal paths for interconnection between a circuit card mated with contacts of a card mating connector 42 of the interfacing connector assembly 12 (best seen in FIG. 2), and electrical interconnections on the mother board. The underside of the interfacing connector assembly also includes positioning elements or alignment posts 50 which extend from the bottom surface of the interfacing connector assembly 12 and which mate with associated indentations in the mother board (not illustrated), to ensure proper alignment between the surface mount leads on the interfacing connector assembly 12 and electrical interconnections on the mother board.

Figure 5:
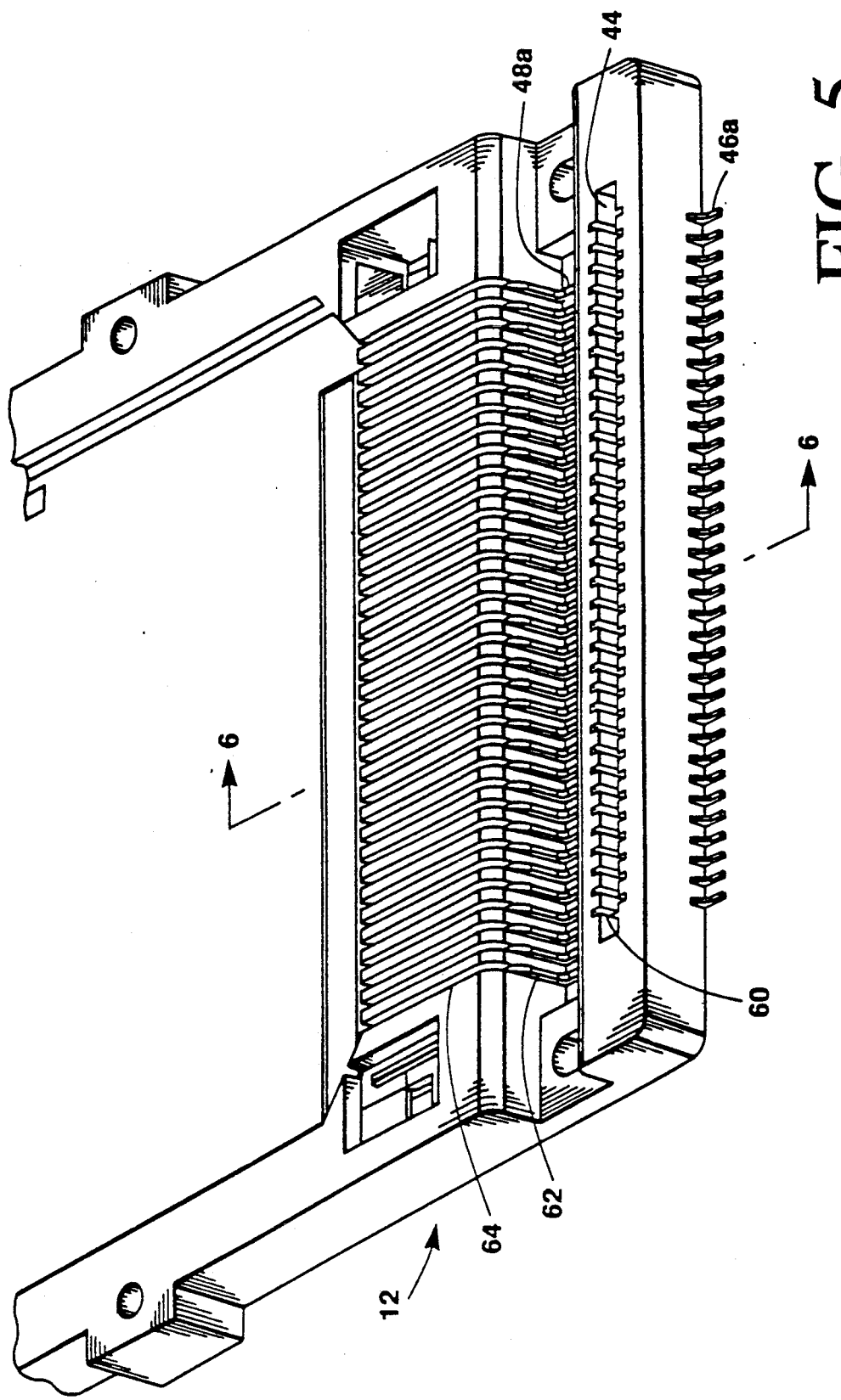
FIG. 5 is a top perspective view of a forward portion of the interfacing connector assembly of FIG. 2.

FIGS. 4-6 best illustrate the positioning and configuration of the forward surface mount leads 46a, 46b, relative to the card edge connector receptacle 44 of the interface connector 12, and associated electrical contacts located therein. In the illustrative embodiment, the electrical contacts associated with respective surface mount leads 46a, 46b are disposed within the connector receptacle to receive and electrically engage an interface portion of the stacking connector assembly 14, described hereinafter, and to facilitate electrical interconnection between the stacking connector assembly 14 and the substrate or motherboard.

Rearward surface mount leads 48a, 48b, of the interfacing connector assembly 12 illustrated in FIGS. 4-6, are configured including an upper row of conductors 62. The upper row of conductors 62 are installed in a plurality of slots 64 accessible on a surface of the interface assembly 12 and terminate in the card mating connector portion 42 as a plurality of interfacing connector assembly upper row pins 66.

A plurality of interfacing connector assembly lower row pins 68 are also illustrated in FIGS. 4-6, in the card mating connector portion 42. The lower row pins 68 terminate at an end as the rearward surface mount leads 48b and have a plurality of interfacing connector assembly lower row conductors 70 disposed therebetween. The lower row of conductors 70, like the upper row of conductors 62, are engaged within slots of the interface assembly 12 dimensioned to maintain the conductors therein, via interference fit. It should be appreciated that respective pins, leads and conductors can be implemented as discrete or unitary electrically conductive elements. Furthermore, as illustrated by dotted lines descending from the leads in FIG. 6, it should be appreciated that although surface mount leads are illustrated and discussed, the leads 46a, 46b, 48a, 48b can project orthogonally from the underside of the interface connector 12 and be implemented for through-hole application.

Figure 7:
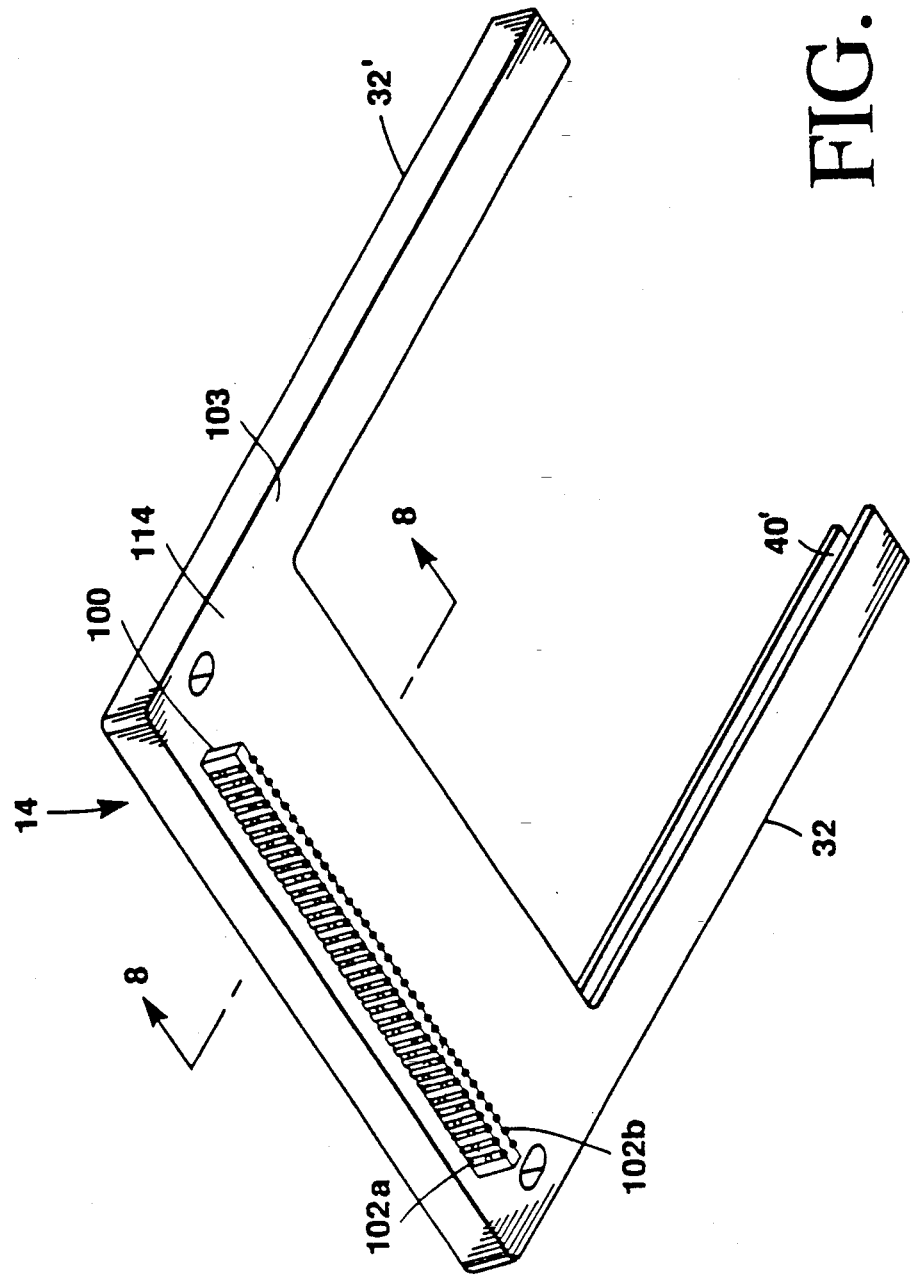
FIG. 7 is a bottom perspective view of a stacking connector assembly according to the invention.

As illustrated in FIGS. 7 and 8, a stacking connector assembly 14, like the interfacing connector assembly 12, includes a substantially U-shaped frame 114, card guide members 32' and card guide channels 40' formed therein. The stacking connector assembly 14 further includes a card edge style interface portion or elongated protuberance 100, as shown clearly in FIG. 7, located on a lower surface 103 of the stacking connector assembly 14 and a pin connector portion 112 located interior to the U-shaped frame 114. The pin connector portion 112 engages a circuit card disposed within the card guide channels 40'. The interface portion or protuberance 100 of the stacking connector assembly 14, mechanically and electrically engages the card edge style interface receptacle or channel 44 of the interfacing connector assembly 12 discussed hereinbefore.

Figure 3:
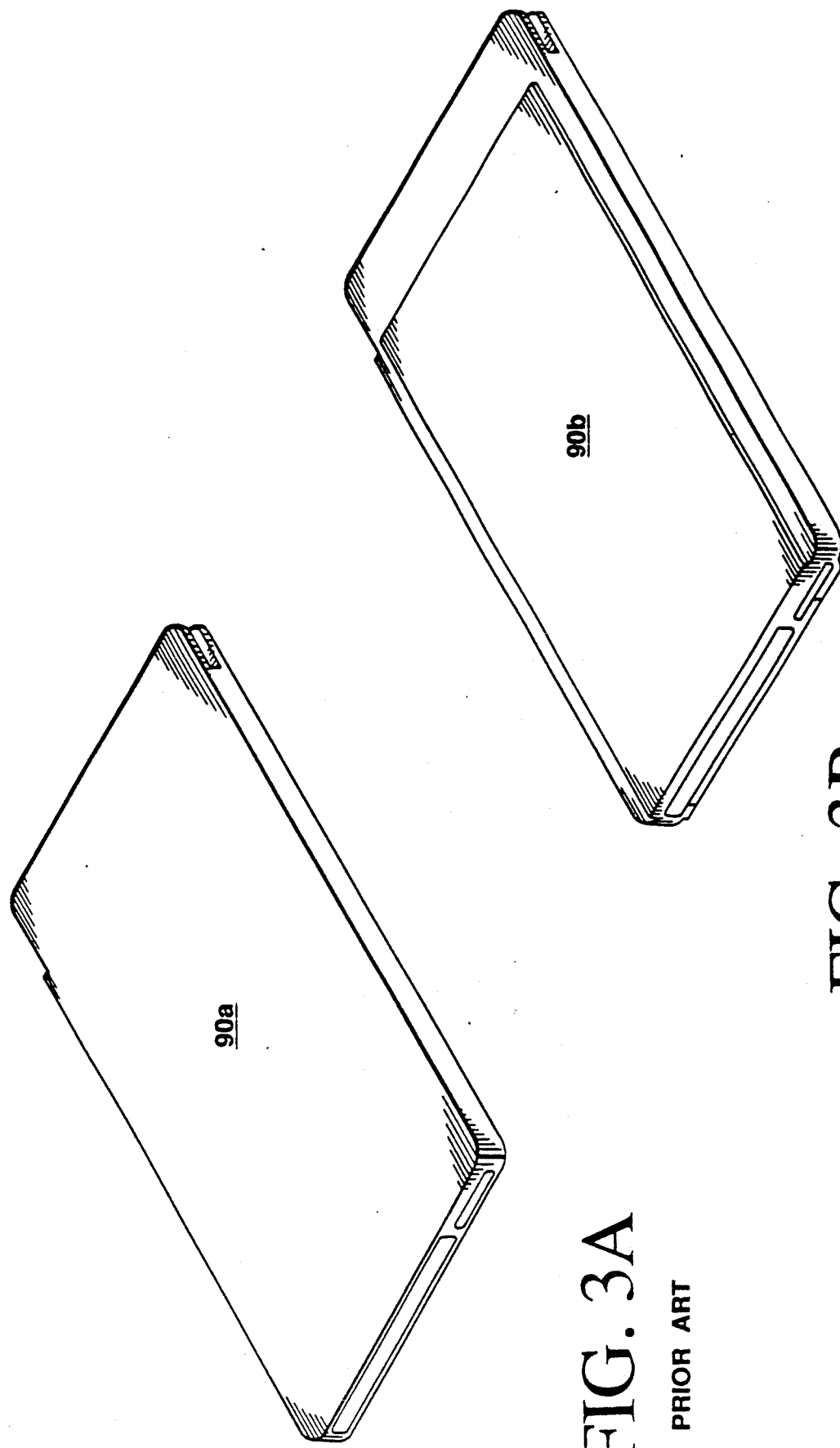
FIGS. 3a and 3b are top perspective views of a Personal Computer Memory Card International Association (PCMCIA) Type I PC card, and PCMCIA Type II PC card, respectively, according to the prior art.

The interface portion 100 includes a plurality of right angle pins 102a, 102b which are substantially equidistantly spaced along two outer sides of the interface portion 100. The pins 102a, 102b are one end of upper and lower row conductors 104, 106 (FIG. 8). The other end of the upper and lower row conductors 104, 106 are upper and lower row connector puns 108, 110 forming the pin connector portion 112, disposed to electrically connect a circuit card, such as illustrated in FIGS. 3a and 3b, to the stacking connector assembly 14. The upper and lower row conductors 104, 106 and associated pins 102a, 102b, 108, 110 are interference fit into the stacking connector assembly 14 and can be comb loaded into slots via an exterior surface of the assembly 14, or otherwise disposed therein.

Referring now to FIG. 1, an interfacing connector assembly 12 and a stacking connector assembly 14, which comprise a circuit card interface system 10, are illustrated in position for electrical and mechanical mating. The pins 102a, 102b of the interface portion 100 of the stacking connector assembly 14 mechanically and electrically engage the electrical contacts 60 of the interface receptacle 44 of the interfacing connector assembly 12 when the stacking and interface connector assemblies 14, 12 are mated together by inserting the interface portion 100 of the stacking connector assembly 14 into the interface receptacle 44 of the interfacing connector assembly 12.

The interfacing and stacking connector assemblies 12, 14 have substantially similar card mating connectors 42, 112 for providing an electrical interface to removable circuit cards such as PCMCIA Type I, Type II, or Type III cards. The appropriate circuit cards are disposed within the card guide channels 40 formed in the two card guide members 32 on both connector assemblies 12, 14.

The interfacing connector assembly 12 is electrically connected, such as by solder attachment, with electrical interconnections on the substrate or mother board. With the stacking connector assembly electrically connected, with the interfacing connector assembly, the circuitry of an upper circuit card installed in the stacking connector assembly 14 is electrically coupled with electrical interconnections on the substrate or mother board, via the upper and lower row conductors 104, 106. The upper and lower row conductors 104, 106 electrically contact the upper circuit card through associated upper and lower row pins 108, 110, which engage the interface connector assembly 12 at the interface receptacle 44 via right angle pins 102a, 102b, which interconnect with the contacts 60 that have surface mount leads 46a, 46b soldered to the electrical interconnections on the mother board.

The circuitry of a lower circuit card installed in the interface connector assembly 12 is electrically engagable with electrical interconnections on the substrate or mother board, via the upper and lower row pins 66, 68. The upper and lower row pins 66, 68 in electrical engagement with the lower circuit card, electrically engage the mother board interconnects via surface mount leads 48a, 48b soldered thereto.

While the interfacing connector assembly and stacking connector assembly are described and illustrated having "card edge style" receptacle(s) and interface portions, respectively, it will be appreciated that alternative interconnection mechanisms can be implemented for mechanically and electrically interconnecting the stacking connector assembly to the interfacing connector assembly. Individual pins and sockets, fingers and associated receptacles, IDS receptacles and short wiring, and DIN style interconnects are only a few examples of alternative interconnection mechanisms that may be implemented.

Although the present invention is described illustratively implementing two connector assemblies stacked, it will be appreciated that the interfacing connector assembly can be modified to include a plurality of stacking connector receptacles (44) to accommodate a plurality of stacking connector assemblies.

Additionally, although the illustrative embodiment(s) described herein have pluralities of surface mount leads configured on the interfacing connector assembly, it should be appreciated that the leads for electrically interconnecting the interfacing connector assembly with the substrate or motherboard can be leads other than surface mount, such as through hole or compression type leads or the like, or combinations thereof.

Furthermore, while the underside of the interfacing connector assembly is described as having alignment posts for aligning the connector(s) with a footprint on a substrate, it will be appreciated that alternative alignment means, such as through holes and pins, and/or various types of hardware or the like can be implemented.

While the interfacing and stacking connector assemblies described herein have a substantially U-shaped circuit card receiving portion including two card guide members dimensioned for receiving PCMCIA standard cards, it will be appreciated that the card receiving portion can be alternatively constructed and dimensioned to receive non-standard cards, and can be constructed with card guide members in excess of two.

Additionally, although the interfacing and stacking connector assemblies are described as having similar card mating connector portions including pins for engaging PCMCIA cards, it should be appreciated that the assemblies can be alternatively implemented, such as having female receptacles for receiving male interconnects on installable cards or having compression type contacts engagable with mating contacts on the mating card(s).

It should be clear from the foregoing that in other embodiments the present invention can be used to interface a wide array of circuit board mounted electronics such as memory cards, I/O cards, card mounted floppy and optical disk drives, microprocessors, and math co-processors, as well as other application specific or specialized use circuitry. In order to accommodate such varied electronics, the card guide channels 40 and interconnects on each connector assembly 12, 14 need not be identical.

Although the invention has been shown and described with respect to an illustrative embodiment thereof, it should be understood by those skilled in the art that the foregoing and various other changes, omissions and additions in the form and detail thereof may be made therein without departing from the spirit and scope of the invention.

What is claimed is:

1. A stackable connector for retaining a first circuit card and a second circuit card comprising:
   a first connector assembly receiving said first circuit card and including,
      a frame having a base including a first surface, a second surface and a third surface and a pair of side members, said side members extending from said base and dimensioned to receive said first circuit card, said base including an insulative portion with an interface channel disposed therein open at said first surface;
      a first plurality of leads disposed in said interface channel and accessible at said first surface of said base, said first plurality of leads providing a first electrical signal path between said first surface and said second surface of said base; and
      a second plurality of leads disposed on said third surface of said base, said second plurality of leads providing a second electrical signal path between said first circuit card and said second surface of said base, said second electrical signal path being electrically and physically separate from said first electrical signal path;
   a second connector assembly receiving said second circuit card and including,
      a second frame having a second base including a first surface, a second surface and a third surface and a second pair of side members, said second pair of side members extending from said base and dimensioned to receive said second circuit card, said second base including a second base insulative portion with an elongated protuberance extending outwardly from said second surface of said second base; and
      a plurality of second connector leads each having a first end disposed on said elongated protuberance, and a second end extending coaxially with respect to said second pair of side members and accessible at said third surface of said second base, said plurality of second connector leads providing an electrical signal path between said third surface and said second surface of said second base, and said elongated protuberance dimensioned to be received in said interface channel whereupon said plurality of second connector leads engage said first plurality of leads disposed in said interface channel.

2. A circuit card interface system, comprising:
   a mother board connector assembly having a first surface, a second surface, and a third surface, said mother board connector assembly having a first plurality of electrical contacts disposed on said third surface adapted to receive a first circuit card and extending to said second surface, said motherboard connector assembly having a second plurality of electrical contacts accessible on said first surface and disposed in a card edge connector receiving portion including an inwardly projecting channel open on said first surface, said second plurality of electrical contacts extending to and being accessible on said second surface; and
   a stacking connector assembly having a first surface, a second surface and a third surface, said stacking connector assembly having a first plurality of stacking connector electrical contacts disposed on said third surface adapted to receive a second circuit card and extending to and being accessible on said second surface, and a second plurality of stacking connector electrical contacts disposed on a card edge connector portion projecting outwardly from said second surface and extending to and being accessible on said first surface, said card edge connector portion being configured for engagement with said card edge connector receiving portion.

3. The circuit card interface system of claim 2, wherein said other board connector assembly further comprises:
a connector assembly frame having a forward end and a rearward end;
said first plurality of electrical contacts integrally disposed in said rearward end of said connector assembly frame; and
said second plurality of electrical contacts integrally disposed in said forward end of said connector assembly frame.

4. The circuit card interface system of claim 3, wherein said mother board connector assembly frame includes said first surface and said second surface and comprises:
a base region;
two card guide members extending rearwardly therefrom;
each of said first and second plurality of electrical contacts being disposed within said base region,
said first plurality of electrical contacts each having a first end exposed toward said rearward end of said mother board connector assembly frame to electrically connect said first circuit card and said mother board connector assembly and said first plurality of electrical contacts each having a second end exposed toward said second surface of said mother board connector assembly frame to electrically connect said mother board connector assembly to a third circuit board, and
said second plurality of electrical contacts each having a first end exposed toward said first surface of said mother board connector assembly frame to electrically connect said mother board connector assembly and said stacking connector assembly and said second plurality of electrical contacts each having a second end exposed toward said second surface of said mother board connector assembly frame to electrically connect said mother board connector assembly to said third circuit board.

5. The circuit card interface system of claim 2, wherein said stacking connector assembly comprises:
a connector assembly frame having a forward end and a rearward end; and
said first plurality of stacking connector electrical contacts integrally disposed in said connector assembly frame.

6. The circuit card interface system of claim 5, wherein said stacking connector assembly frame includes said first surface and said second surface and comprises:
a base region;
two card guide members extending rearwardly therefrom;
at least a portion of said first plurality of electrical contacts being disposed within said base region, said first plurality of electrical contacts each having,
a first end exposed toward said rearward end of said stacking connector assembly frame to electrically connect said second circuit card and said stacking connector assembly; and
a second end exposed toward said second surface of said stacking connector assembly frame to electrically connect said stacking connector assembly and said mother board connector assembly.

7. A connector system for retaining at least one circuit card, comprising:
an interface connector assembly having a top surface and a bottom surface, a first connector mating portion including a card edge connector receiving channel extending inwardly from said top surface, a first card mating portion, a first plurality of electric signal paths provided by a first plurality of leads having a first end disposed in said card edge connector receiving channel extending inwardly from said top surface and a second end disposed at said bottom surface, and a second plurality of electric signal paths provided by a second plurality of leads having a first end disposed on said bottom surface and a second end disposed at said first card mating portion, wherein said first plurality of electric signal paths are electrically and physically separate from said second plurality of electric signal paths; and
a stacking connector assembly having a top surface and a bottom surface, a second connector mating portion including a card edge connector protuberance extending outwardly from said bottom surface and a second card mating portion, and a plurality of leads having a first end disposed on said card edge connector protuberance at said second connector mating portion and a second end disposed at said second card mating portion for establishing electrical signal paths between said interface connector assembly and said stacking connector assembly when said card edge connector protuberance of said second connector mating portion is in engagement with said card edge connector receiving channel of said first connector mating portion.

8. The connector system of claim 7, wherein two card guide members extend rearwardly from a base region of said interface connector assembly, said card guide members dimensioned to slidably receive a first circuit card and align an edge of said first circuit card with said first card mating portion.

9. The connector system of claim 7, wherein two card guide members extend rearwardly from a base region of said stacking connector assembly, said card guide members dimensioned to slidably receive a second circuit card and align an edge of said second circuit card with said second card mating portion.

* * * * *

UNITED STATES PATENT AND TRADEMARK OFFICE
CERTIFICATE OF CORRECTION

PATENT NO. : 5,334,046
DATED : August 2, 1994
INVENTOR(S) : Peter Brouillette, et al.

It is certified that error appears in the above-indentified patent and that said Letters Patent is hereby corrected as shown below:

Column 4, line 13, "puns" should read --pins--.

Signed and Sealed this

Fifteenth Day of August, 1995

Attest:

BRUCE LEHMAN

Attesting Officer

Commissioner of Patents and Trademarks